United States Patent [19]
Yamagata et al.

[11] Patent Number: 5,640,100
[45] Date of Patent: Jun. 17, 1997

[54] PROBE APPARATUS HAVING PROBE CARD EXCHANGING MECHANISM

[75] Inventors: Kazumi Yamagata; Minoru Uchida, both of Yamanashi-ken, Japan

[73] Assignees: Tokyo Electron Limited, Tokyo; Tokyo Electron Yamanashi Limited, Nirasaki, both of Japan

[21] Appl. No.: 546,164

[22] Filed: Oct. 20, 1995

[30] Foreign Application Priority Data

| Oct. 22, 1994 | [JP] | Japan | 6-282688 |
| Nov. 2, 1994 | [JP] | Japan | 6-293946 |
| Nov. 29, 1994 | [JP] | Japan | 6-321249 |
| Mar. 20, 1995 | [JP] | Japan | 7-087476 |

[51] Int. Cl.⁶ .................................................. G01R 31/02
[52] U.S. Cl. ..................................... 324/754; 324/758
[58] Field of Search ................................ 324/754, 750, 324/755, 758, 759, 765, 158.1, 73.1; 439/482, 824; 437/8

[56] References Cited

U.S. PATENT DOCUMENTS

| 3,185,927 | 5/1965 | Margulis et al. | 324/759 |
| 4,568,879 | 2/1986 | Nakamura et al. | 324/759 |
| 4,965,515 | 10/1990 | Karasawa | 324/759 |
| 5,086,270 | 2/1992 | Karasawa et al. | 324/754 |
| 5,254,939 | 10/1993 | Anderson et al. | 324/754 |
| 5,315,237 | 5/1994 | Iwakura et al. | 324/754 |
| 5,528,158 | 6/1996 | Sinsheimer et al. | 324/758 |

FOREIGN PATENT DOCUMENTS

| 63-217636 | 9/1988 | Japan . |
| 64-53428 | 3/1989 | Japan . |
| 1-145587 | 6/1989 | Japan . |
| 7-147306 | 6/1995 | Japan . |

*Primary Examiner*—Vinh P. Nguyen
*Attorney, Agent, or Firm*—Oblon, Spivak, McClelland, Maier & Neustadt, P.C.

[57] ABSTRACT

A probe apparatus for examining an electrical characteristic of IC chips formed on a semiconductor wafer has a work table provided in a casing and a probe card provided above the work table. The probe card is detachably attached to an insert ring supported by the casing. A card exchanging mechanism for automatically attaching and detaching the probe card to and from the insert ring is provided. The card exchanging mechanism has a tray for mounting the probe card and transferring the probe card. The tray is changeable at an initial position outside the casing between a usable state where the tray is horizontally expanded and an unusable state where the tray is vertically folded. An opening/closing cover is provided to cover the tray in the unusable state.

22 Claims, 14 Drawing Sheets

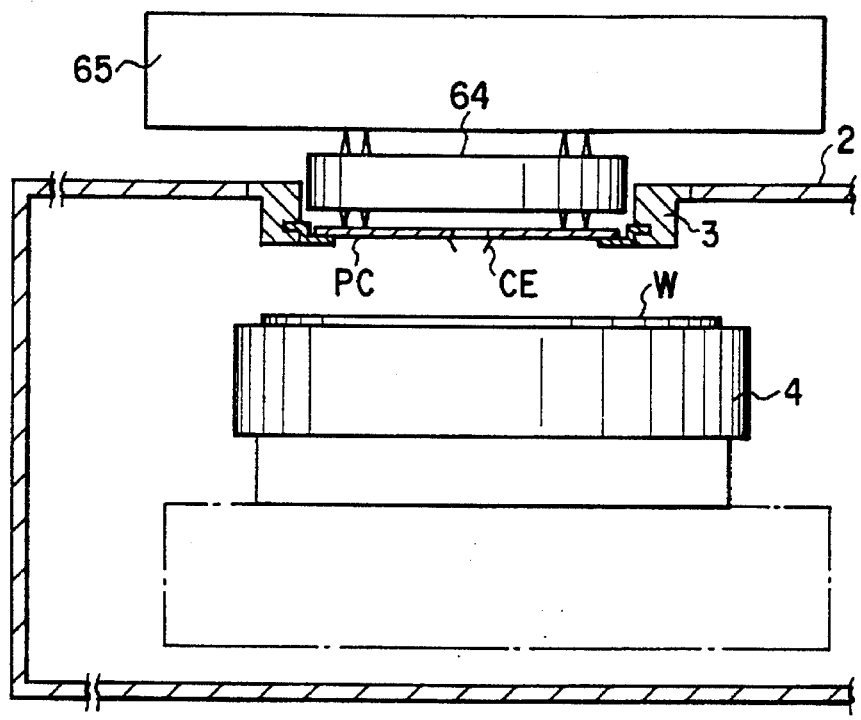
F I G. 3
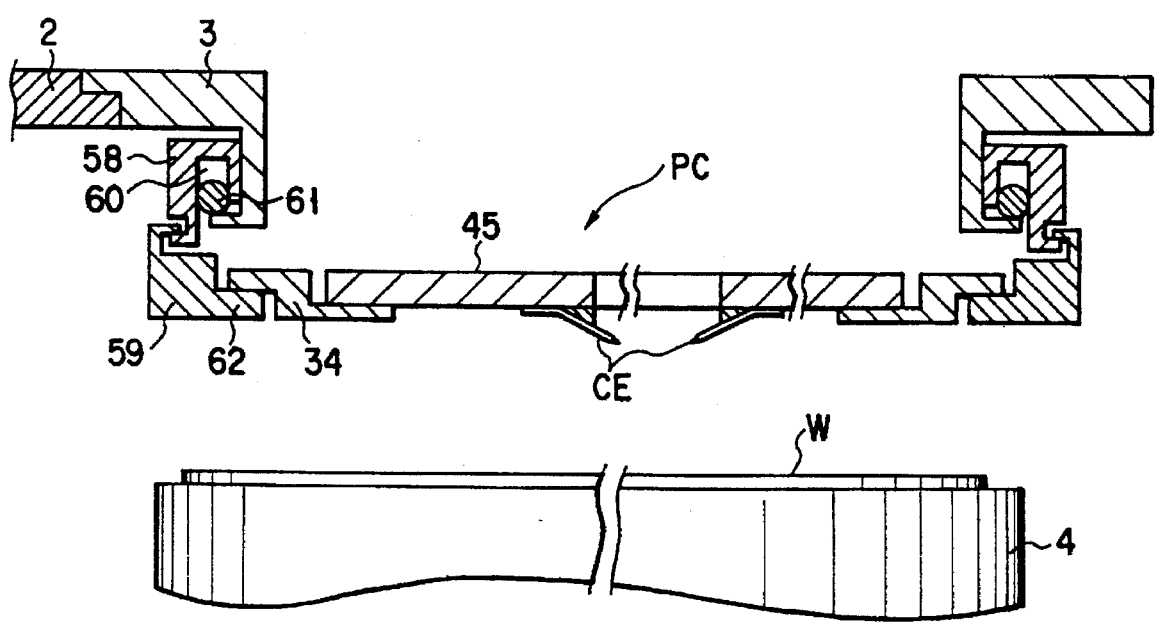
F I G. 4

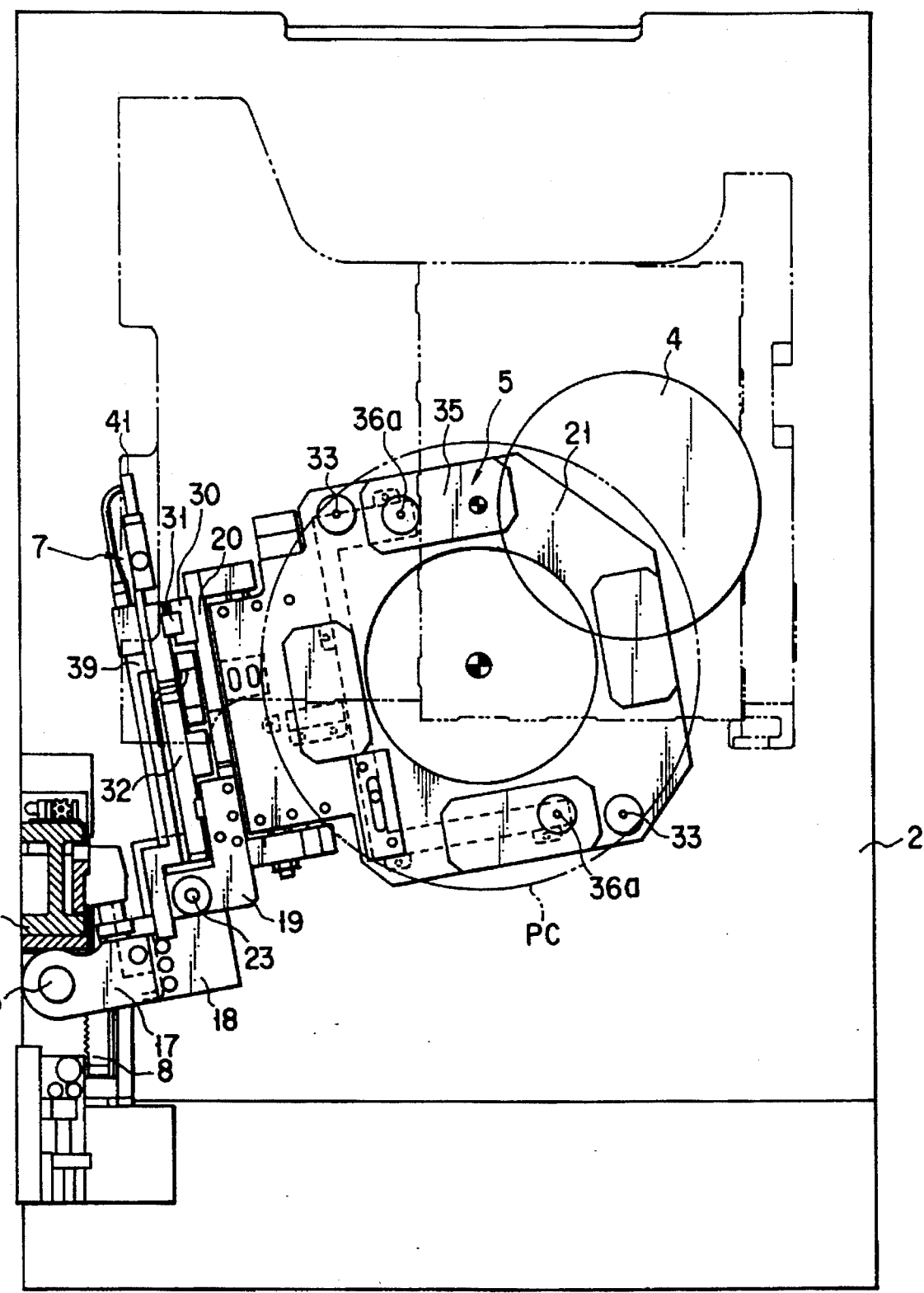
F I G. 6

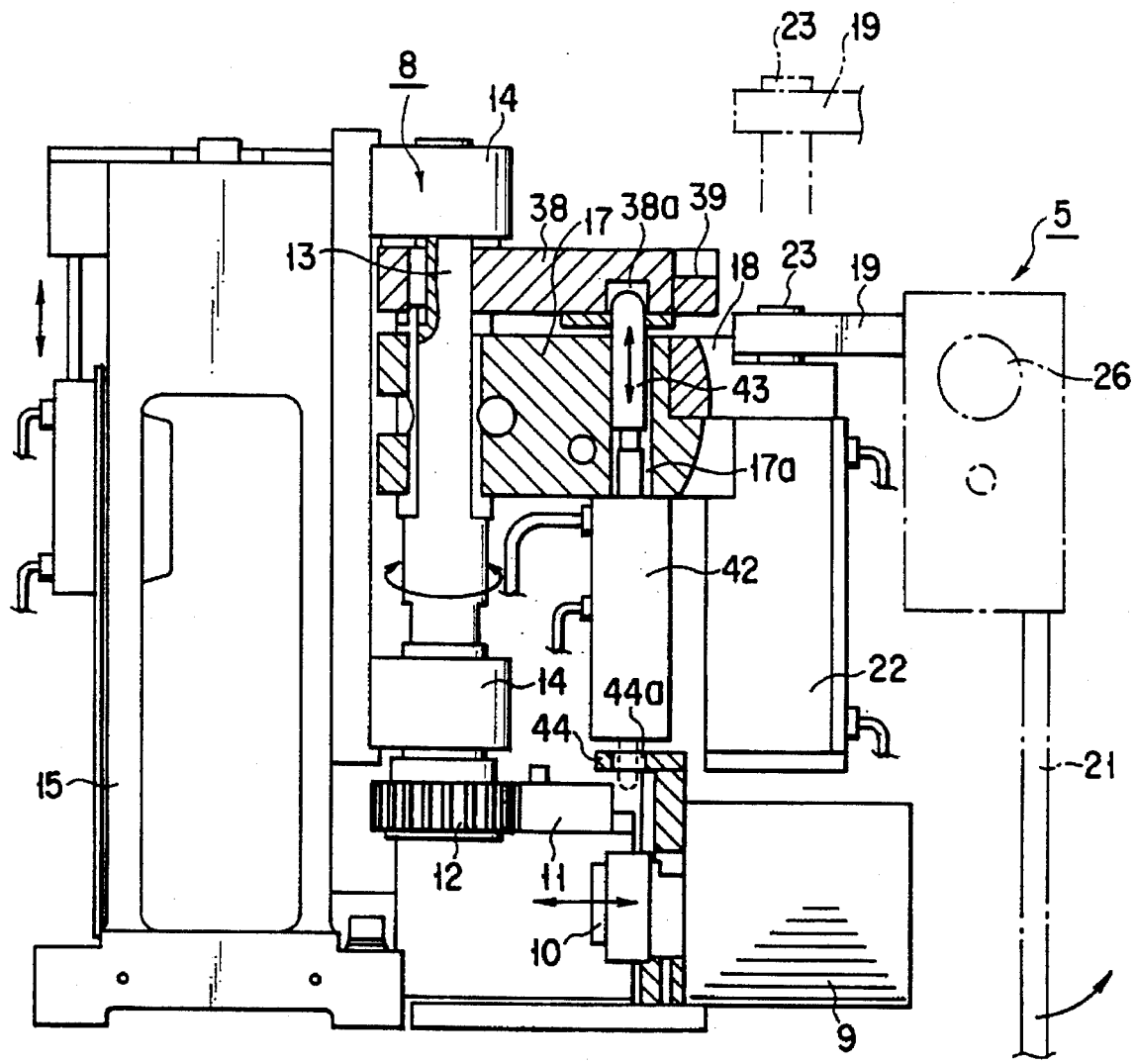
F I G. 9
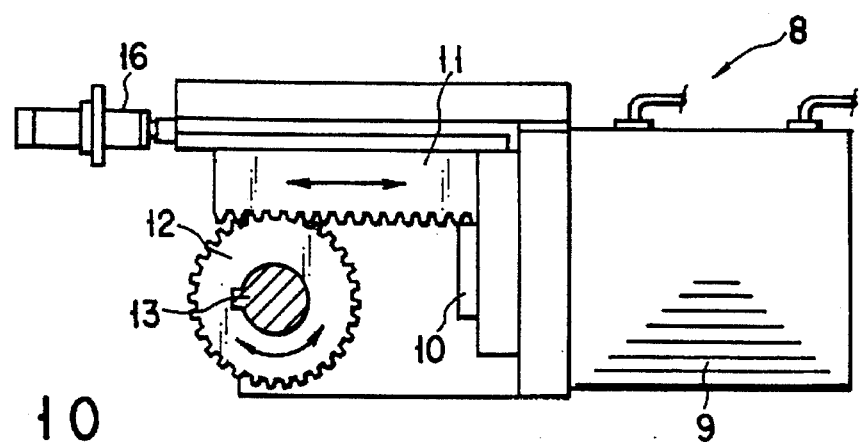
F I G. 10

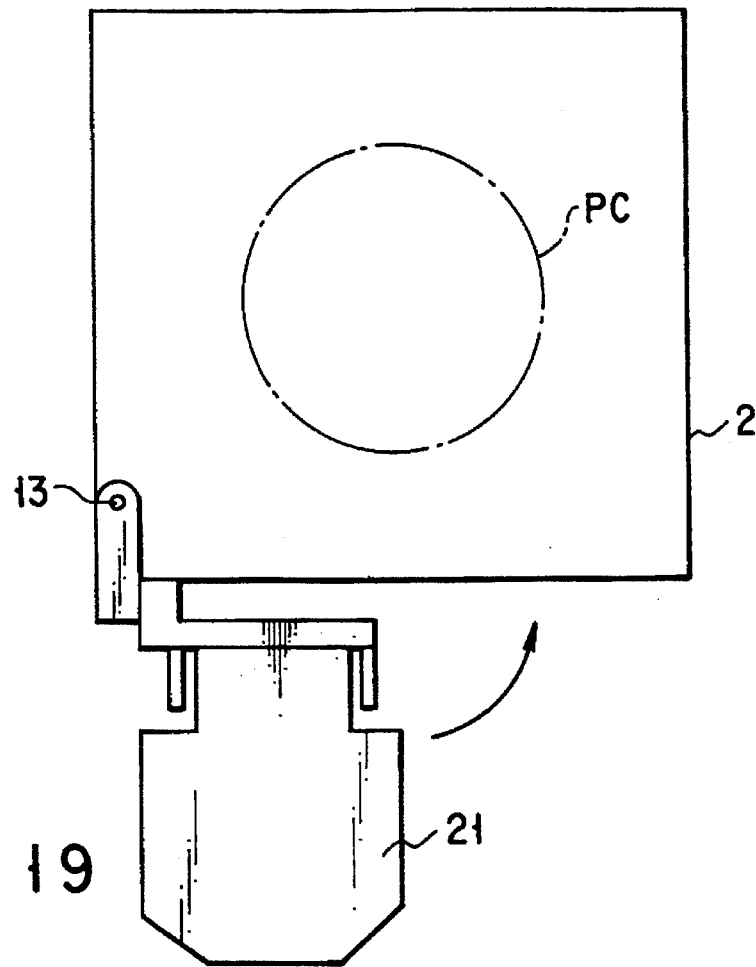
F I G. 19
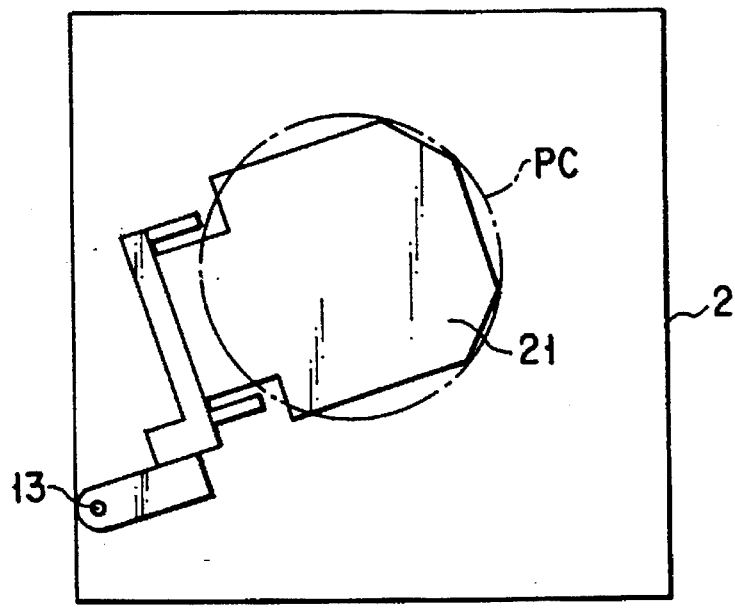
F I G. 20

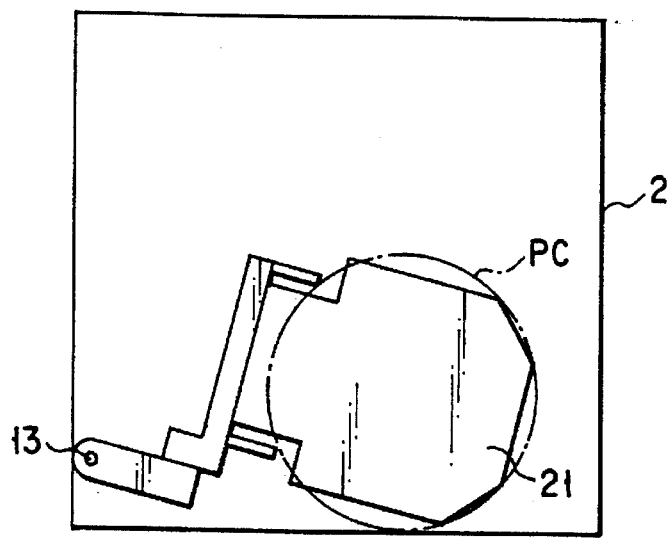
F I G. 21
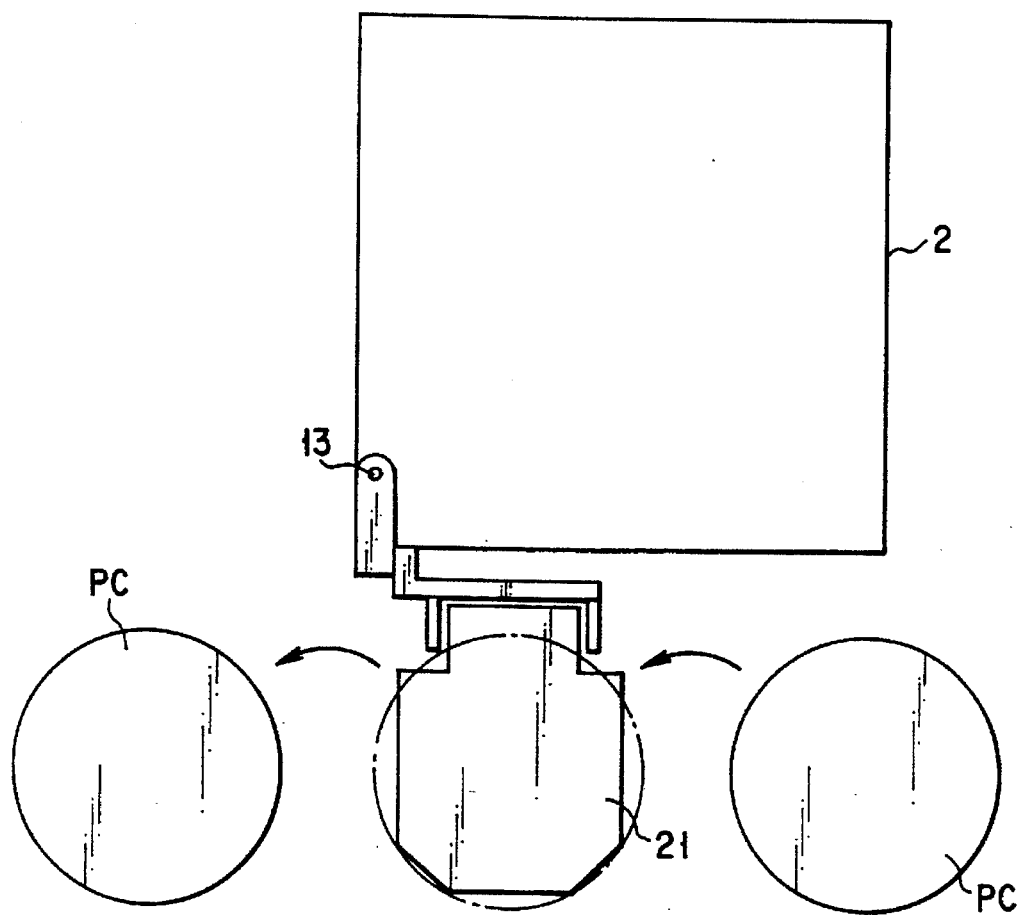
F I G. 22

PROBE APPARATUS HAVING PROBE CARD EXCHANGING MECHANISM

BACKGROUND OF THE INVENTION

1. Field of the Invention

The present invention relates to a probe apparatus and more particularly to a probe apparatus having an improved probe card exchange mechanism.

2. Description of the Related Art

There has been known a probe apparatus for examining electrical characteristics of a plurality of IC chips formed on a semiconductor wafer. This kind of probe apparatus comprises a probe card having probes, that is, contact elements provided to correspond to electrode pads of each IC chip. The probe card is attached to an insert ring supported by the head plate of an apparatus casing. A work table, which is movable in horizontal directions (X, Y directions) and a vertical direction (Z direction) and which is rotatable in a θ direction, is provided below the insert ring, that is, below the probe card.

At the time of examining, the work table is moved in the X, Y and θ directions such that the electrode pads of each IC chip provided on the wafer are opposite to the corresponding probes of the probe card. Then, the work table is moved up such that the electrode pads of the IC chip come in electrically contact with the probes. These operations are performed every IC chip or every group consisting of a plurality of IC chips. In a state that the electrode pads of each IC chip are in electrical contact with the probes, an electrical signal is sent to the IC chip, and the electrical characteristic of the IC chip is examined.

Moreover, in order to provide a mark to an IC chip, which has been recognized to be defective by the examination, a marking mechanism is provided. An ink applying section of the marking mechanism, that is, a pen is provided at a marking area separated from a probing area in which the probe card is arranged. At the time of marking, the work table on which the wafer is mounted is moved such that an IC chip, which has been recognized to be defective, is opposite to the pen of the marking mechanism. Then, ink is dropped from the pen, and the mark is applied to the defective IC chip.

The probe card is formed to examine only one kind of IC chip. Due to this, the probe card has to be exchanged for a new one in accordance with the kinds of IC chips formed on the wafer. In recent years, various kinds of IC chips have been manufactured in order to fulfill various functions of electronic equipments. Due to this, the exchange of the probe card has become frequent. As a method for exchanging the probe card, there are used a method for automatically exchanging the probe card and a method for manually exchanging the probe card.

In the case of the automatic exchanging method, a plurality of probe cards are prepared in a stock chamber of the probe apparatus in advance. The probe cards are automatically picked up from the stock chamber by an automatic exchanger incorporated into the probe apparatus.

In the case of the manual exchanging method, a head plate, which is supported by a apparatus casing and having a probe card attached thereto, is swung up by an operator from the front side of the probe apparatus to a back side by a predetermined angle to be opened. Then, in a state that the head plate is kept open and inclined, the probe card is exchanged. In this case, the probe card is exchanged as being attached to a card holder. Then, the head plate is swung again to be returned to the usable position.

In the case of the automatic exchanging method, the probe card can be automatically exchanged without using the operator's hand. However, the automatic exchanger is mechanically complex, and is expensive. Also, the maintenance of the automatic exchanger becomes complicated. Also, several kinds of probe cards, which are not urgently needed, must be stocked in addition to a probe card, which are currently used. For these reasons, the cost of the probe apparatus becomes high.

In the case of the manual exchanging method, since it is unnecessary to stock extra probe cards, and no automatic exchanger is provided, the cost of the probe apparatus becomes low. However, every time when the probe card is exchanged, the operator must open and close the head plate and detach and attach the probe card with a card holder. In recent years, the plurality of IC chips are examined at the same time in accordance with demands for a high-speed examination. As a result, the diameter of the probe card and that of the card holder are enlarged. Also, the probe card and the card holder are increased in the weight. Due to this, in the case of the manual exchanging operation of the probe card, much effort and attention have been needed.

As other problems, various considerations must be taken in providing the marking mechanism. One is that the marking mechanism must be provided in order not to hinder the probing operation. The other is that the maintenance of the marking mechanism must be made easy. For these reasons, the marking area is provided to be separated from the probing area, thereby causing the size of the probe apparatus to be enlarged.

SUMMARY OF THE INVENTION

An object of the present invention is to provide a probe apparatus comprising a probe card exchanging mechanism which does not need a large amount of space, and which is not expensive.

Another object of the present invention is to provide a probe apparatus comprising an exchanging mechanism of a probe card whose operation is easy and safe.

Still another object of the present invention is to provide a probe apparatus comprising a marking mechanism, which does not need a large amount of space and which can easily maintained.

According to a first aspect of the present invention, there is provided a probe apparatus for examining an electrical characteristic of IC chips formed on a semiconductor wafer and having a plurality of electrode pads, comprising:

a casing;

a work table arranged in the casing for mounting the wafer thereon;

an insert ring arranged above the work table and supported by the casing;

a probe card detachably attached to the insert ring, the probe card having a plurality of contact elements to be respectively brought into contact with the electrode pads of the IC chips;

a card exchanging mechanism for automatically attaching and detaching the probe card to and from the insert ring, the card exchanging mechanism comprising a tray for conveying the probe card between an initial position outside the casing and a position inside the casing, and the tray being changeable at the initial position between a usable state where the tray is expanded to mount the probe card thereon and an unusable state where the tray is folded;

an opening/closing cover, provided in the casing, for covering the tray in the unusable state; and a controlling section for controlling an operation of the card exchanging mechanism in accordance with a predetermined program.

According to a second aspect of the present invention, there is provided a probe apparatus for examining an electrical characteristic of a target object having a plurality of electrode pads, comprising:

a casing;

a work table arranged in the casing for mounting the target object thereon;

an insert ring arranged above the work table and supported by the casing;

a probe card detachably attached to the insert ring, the probe card having a plurality of contact elements to be respectively brought into contact with the electrode pads of the target object;

a card conveyer having a tray for conveying the probe card, the tray being movable between an initial position outside the casing and a transfer position below the insert ring, the tray being changeable at the initial position between a usable state where the tray is expanded to mount the probe card thereon and an unusable state where the tray is folded;

an opening/closing cover, provided in the casing, for covering the tray in the unusable state;

a card clamp for fixing the probe card to the insert ring and transferring the probe card to and from the tray placed at the transfer position, the probe card being automatically attached to and detached from the insert ring in cooperation with the card conveyer and the card clamp; and a controlling section for controlling an operation of the card conveyer and the card clamp in accordance with a predetermined program.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 3 is a side view schematically showing the relationship among a work table of the probe apparatus of FIG. 1, a probe card, and a test head;

FIG. 4 is a side view schematically showing the relationship between an insert ring of the probe apparatus of FIG. 1, and the probe card;

FIG. 6 is a plane view showing the inside of the probe apparatus of FIG. 1, in which the probe card is transferred to a position below the insert ring by the card conveyer;

FIG. 9 is a partially broken side view showing the details of the driver of FIG. 8;

FIG. 10 is a plane view showing the main part of the driver of FIG. 8;

FIG. 18 is a partially broken front view showing the main part of the insert ring and the card clamp of

FIG. 17; and

FIGS. 19 to 22 are plane views schematically showing the exchanging operations of the probe card in order.

DETAILED DESCRIPTION OF THE PREFERRED EMBODIMENT

Figure 1:
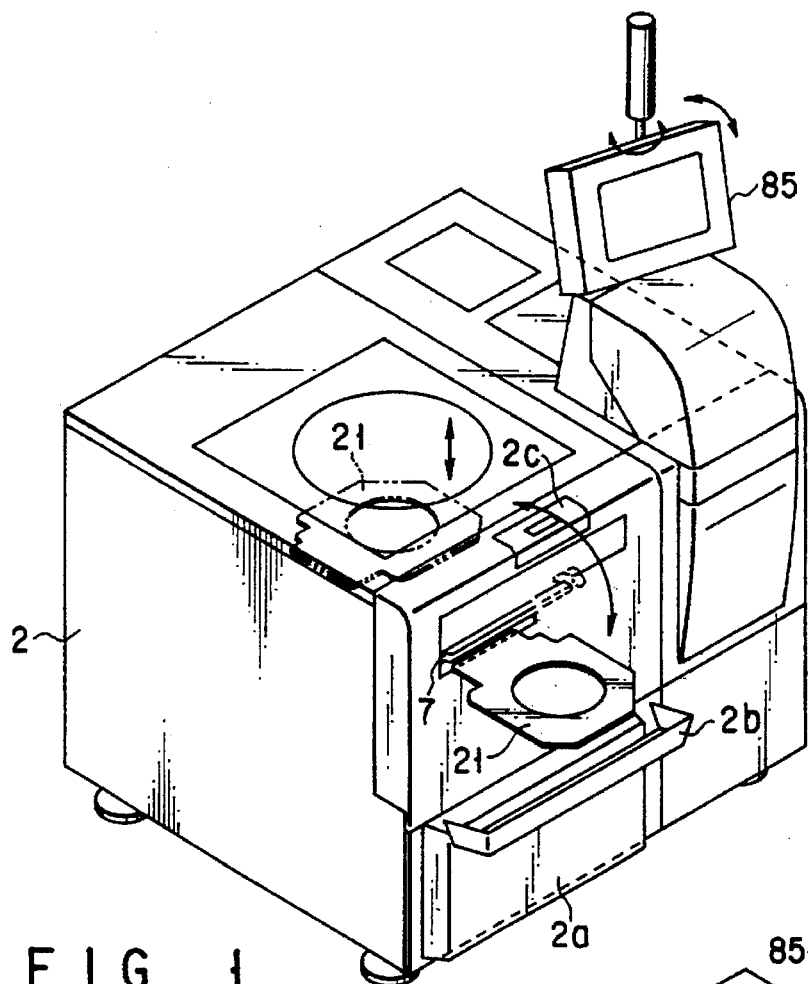
FIG. 1 is a perspective view showing a probe apparatus according to an embodiment of the present invention, in which a tray of a card conveyer is set in a usable state.
Figure 2:
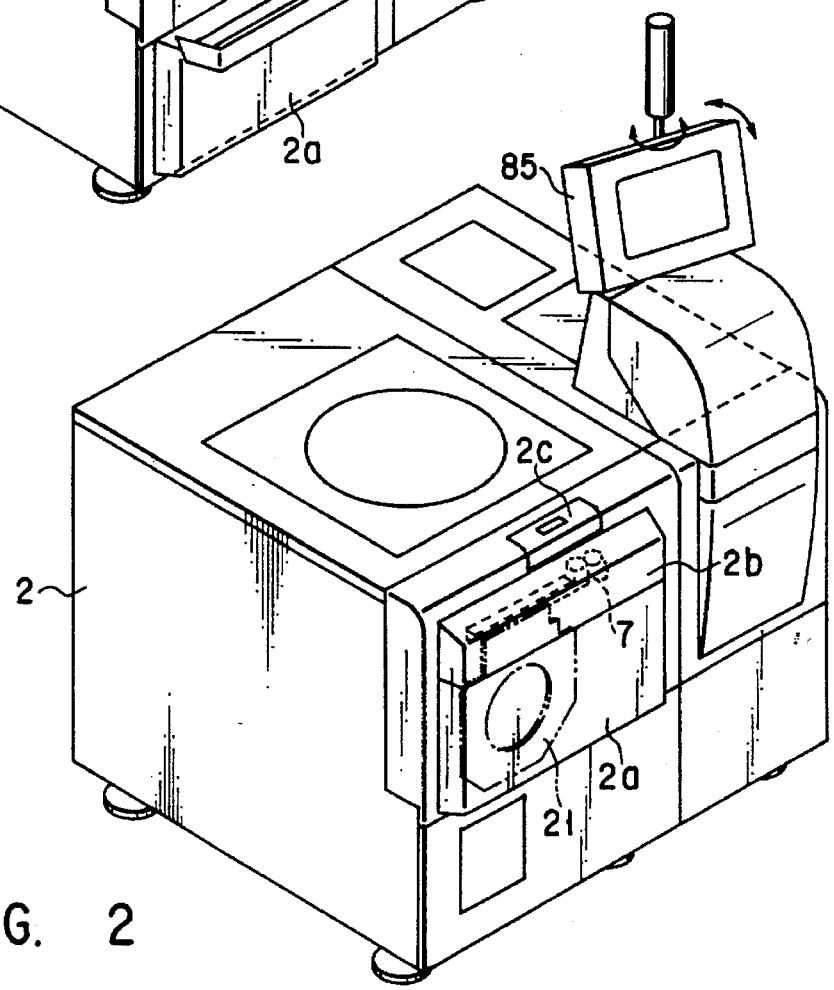
FIG. 2 is a perspective view showing a probe apparatus of FIG. 1, in which the tray of the card conveyer is set in an unusable state.

A probe apparatus of the embodiment of the invention of FIG. 1 is structured so as to examine an electrical characteristic of a plurality of IC chips formed on a semiconductor wafer. As shown in FIGS. 1 to 3, the probe apparatus comprises a casing 2, and a probe card PC attached under the head plate of the casing 2. The probe card PC comprises a card body 45, and a card holder 34 for holding the card body 45. A plurality of probes, that is, contact elements CE, which correspond to electrode pads of the respective IC chips, are provided in the card body 45.

The probe card PC is attached to an insert ring 3 supported by a head plate of the casing 2. A test head 65, which is connected to a tester (not shown), is provided above the probe card PC. The probe card PC and the test head 65 are electrically connected to each other through a contact ring 64. On the other hand, below the insert ring, that is, below the probe card, there is provided a work table 4 for mounting a semiconductor wafer W. The work table 4 is movable in horizontal directions (X, Y directions) and a vertical direction (Z direction) and is rotatable in a θ direction.

At the time of examination, the work table 4 is moved in the X, Y, and θ directions under control of a controller (not shown) such that the electrode pads of the respective IC chips provided on the wafer W are opposite to the corresponding probes CE of the probe card PC. Then, the work table 4 is moved up such that the electrode pads of the IC chips are brought into electrically contact with the probes CE. These operations are performed every IC chip or every group consisting of a plurality of IC chips. In a state that the electrode pads of the IC chips are in electrical contact with the probes CE, an electrical signal is sent to the IC chips through the test head 65 and the contact ring 64, so that an electrical characteristic of the IC chips is examined.

Figure 5:
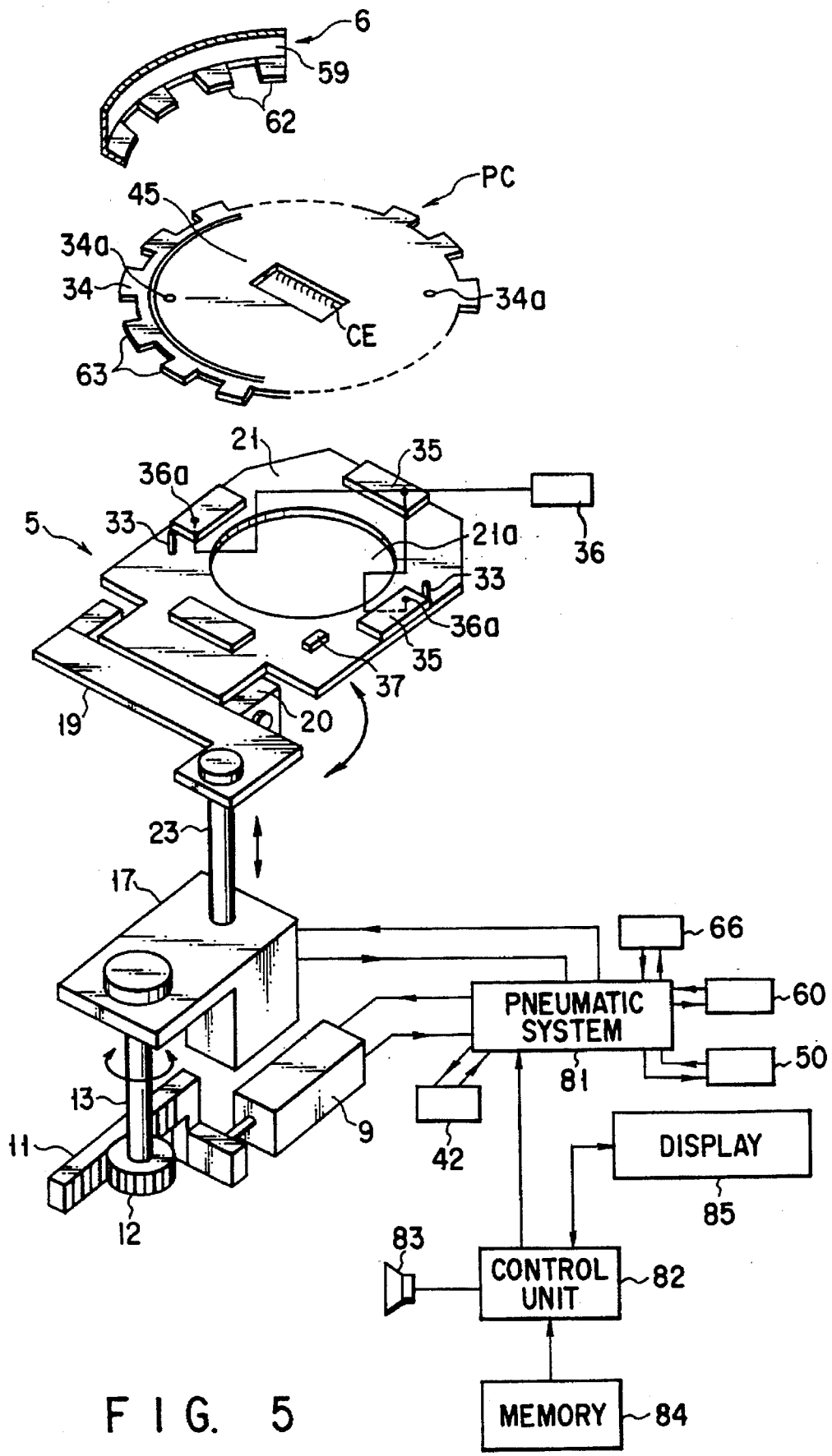
FIG. 5 is a perspective view showing the card conveyer of the probe apparatus of FIG. 1, particularly, the details of the tray.

As given an outline in FIGS. 4 to 6, a card exchanging mechanism comprising a card conveyer 5 and a card clamp 6 is provided in order to exchange the probe card PC. The card conveyer 5 transfers the probe card PC between a position outside the probe apparatus and a position where the probe card PC is engaged with the card clamp 6 directly below the insert ring 3. The card clamp 6, which is provided to accompany the insert ring 3, moves the probe card PC between the card conveyer 5 and the insert ring 3.

Figure 7:
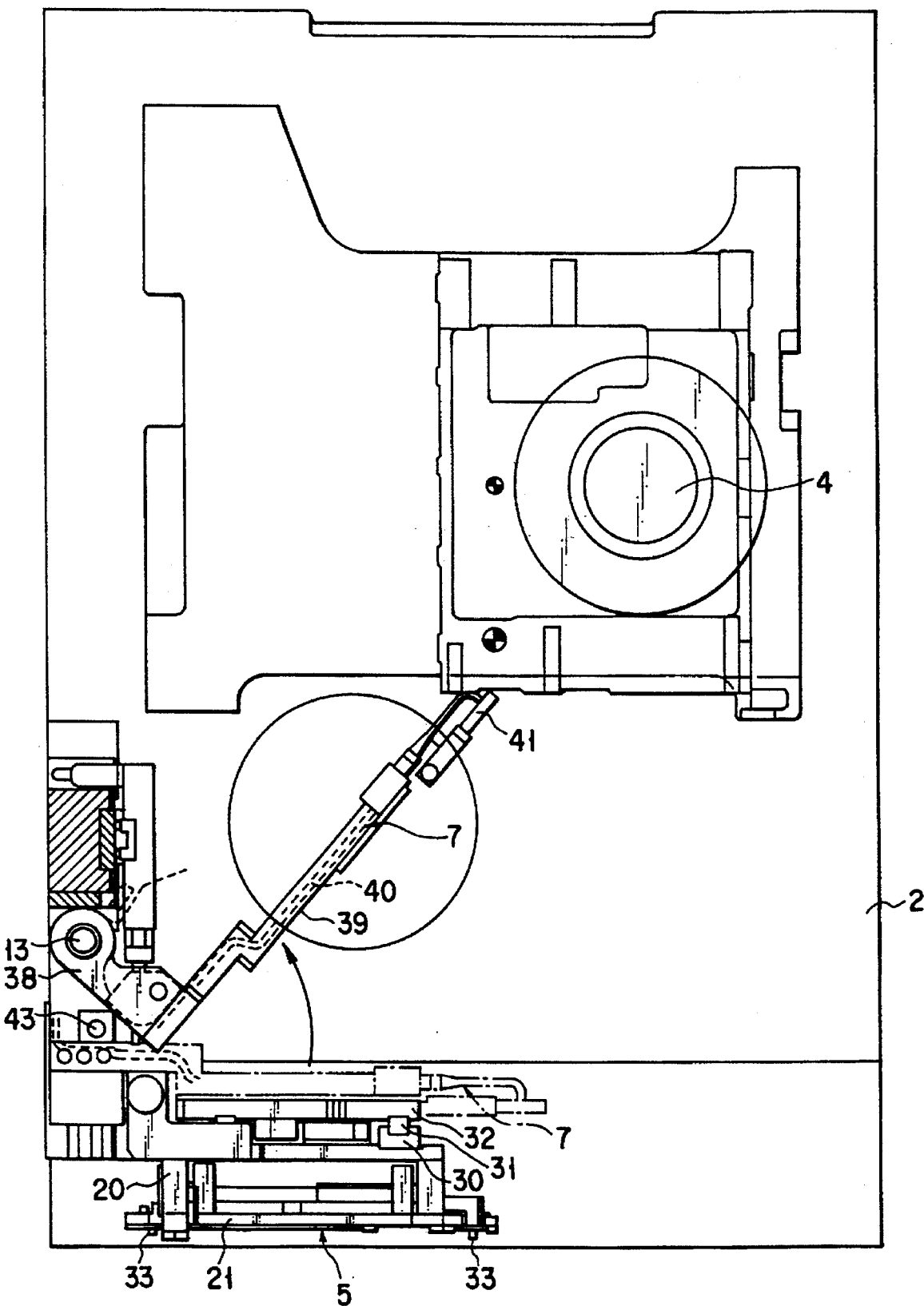
FIG. 7 is a plane view showing the inside of the probe apparatus of FIG. 1, in which a pen of the marking mechanism is moved to a marking position.

In order to provide a mark to the IC chip recognized to be defective by the examination, a marking mechanism 7 is provided as outlined in FIGS. 6 and 7. The marking mechanism 7 has a swing drive 8, which is common to the card conveyer 5, and can bidirectionally rotate at the upper portion of the work table 4. At the time of exchanging the probe card PC, the marking mechanism 7 is coupled to the card conveyer 5 to be rotated therewith. At the time of marking, the marking mechanism 7 is released from the card conveyer 5, and rotated by itself.

Figure 8:
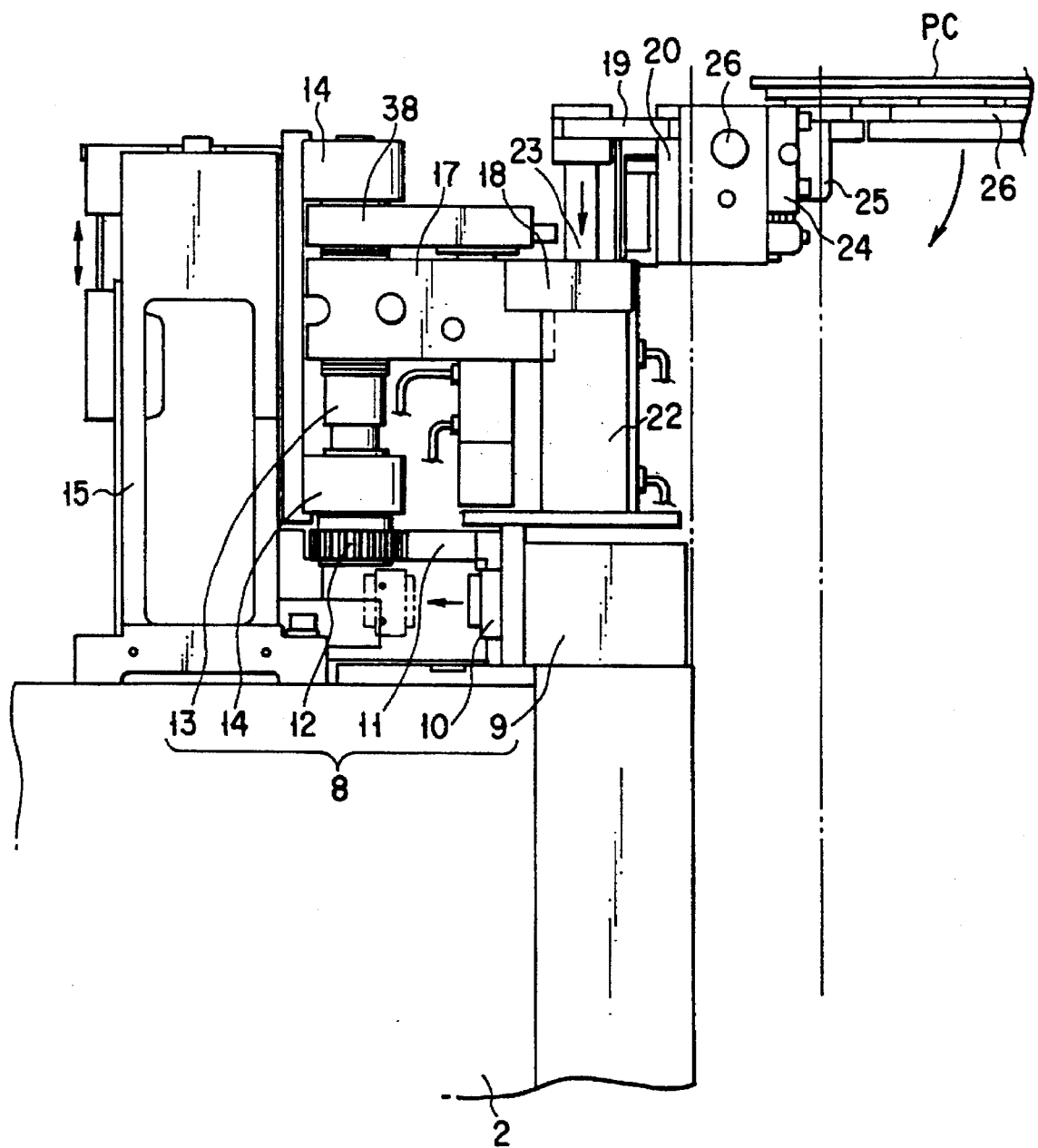
FIG. 8 is a side view showing the card conveyer of the probe apparatus of FIG. 1, and a swing driver for rotating the marking mechanism.

As shown in FIGS. 8 to 10, the swing driver 8 comprises a driving source, such as an air cylinder 9, provided at a corner of the casing 2. A rack 11 is coupled to a horizontal motion rod 10 of the air cylinder 9 and moved with the rod 10. A pinion 12, which is fixed to a lower end of a vertical shaft 13, is engaged with the rack 11. The vertical shaft 13 is rotatably supported by tapered roller bearings 14 arranged at two positions, a slightly above the pinion 12 and the upper end portion. The ball bearing 14 is fixed to a test head support 15 uprightly formed along the side surface of the casing 2. Therefore, the vertical shaft 13 is bidirectionally rotated by the drive of the air cylinder 9 through the rack 11 and the pinion 12. Moreover, as shown in FIG. 10, a shock absorber 16 is provided to the rack 11.

A lower swing base 17, which is horizontally extended and elongated, is supported by the vertical shaft 13 of the swing driver 8. The lower swing base 17 is arranged relative to the vertical shaft 13 to be fixed in the vertical direction and to be unfixed in the rotational direction, so that the lower swing base 17 is freely rotatable to the vertical shaft 13 through the bearing. An air cylinder 22 is fixed to the distal end of the lower swing base 17 through an attachment 18. The air cylinder 22 has a rod 23, which is vertically moved through a hole formed in the attachment 18. A pivot holder 20 is fixed to the upper end of the rod 23 through an attachment 19.

Figure 13:
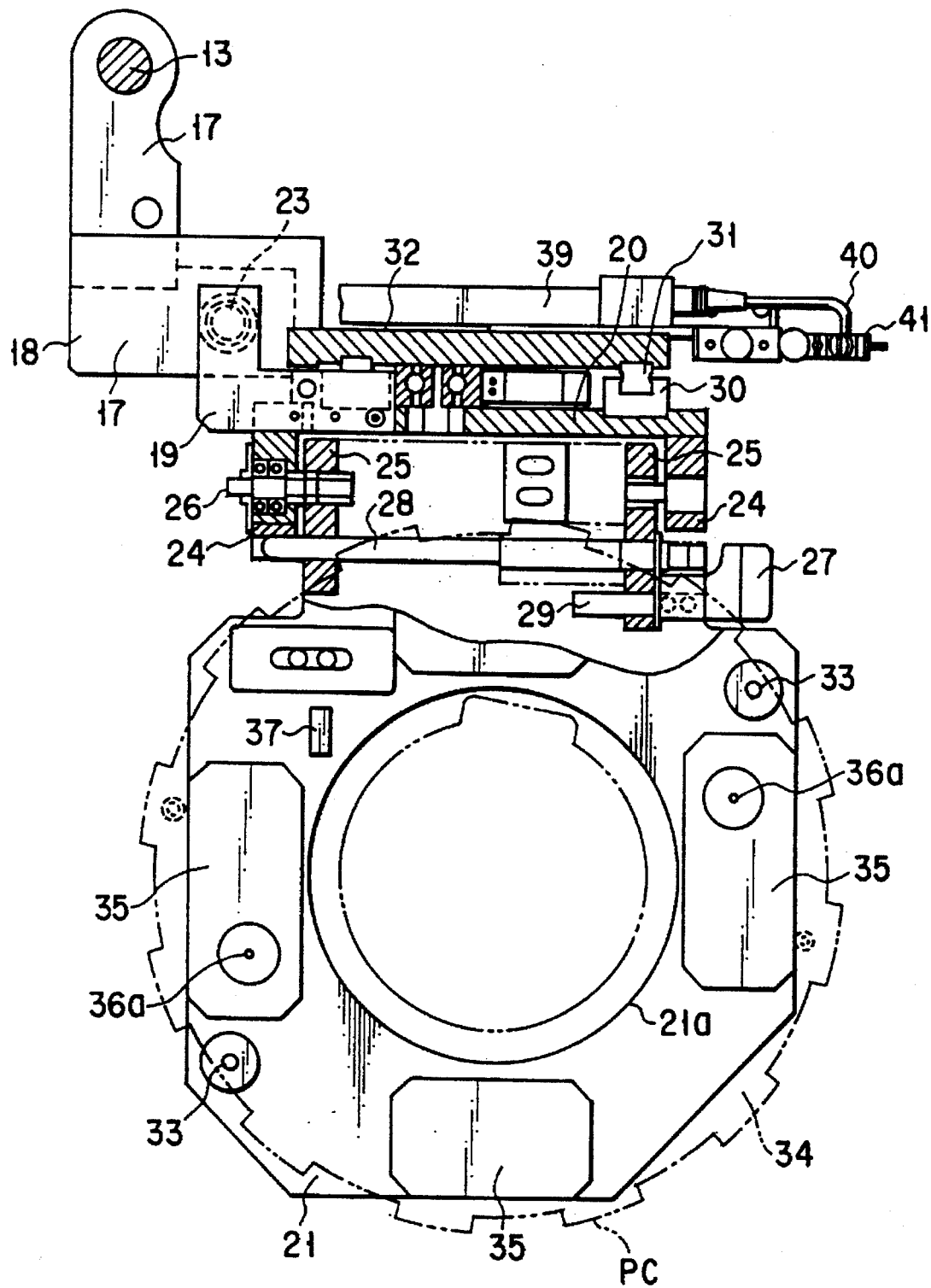
FIG. 13 is a partially broken plane view showing the tray of FIG. 5 in the usable state.

A tray 21, which is used for mounting the probe card PC in exchanging the probe card PC, pivotally supported by the pivot holder 20. More specifically, as shown in FIG. 13, the pivot holder 20 comprises a pair of parallel brackets 24 at both right and left sides. In contrast, the tray 21 comprises a pair of brackets 25 at both right and left sides of its base end inserted between the brackets 24 of the pivot holder 20. The brackets 24 of the holder 20 and the brackets 25 of the tray 21 are pivotally supported by a pair of pins 26 whose axes are horizontally set. Therefore, the tray 21 can be swung around the pins 26, serving as a center.

A lock member 27 is provided at the brackets 25 of the tray 21 to horizontally fix the tray 21. The lock member 27 has two parallel lock shafts 28 and 29, which are positioned to be shifted from the pin 26 and which have different lengths. Both lock shafts 28 and 29 are movably supported to the brackets 25. The long lock shaft 28 is used to fix the tray 21 and the short lock shaft 29 is used as a stopper for stopping the rotation of the lock member 27 itself.

Two lock holes, which are used to insert the end portion of the long lock shaft 28, are formed in the left bracket 24 of the pivot holder 20 at two positions so as to correspond to the uppermost state of the tray 21 where it is horizontally set and the lowermost state of the tray 21 where it is vertically set. When the end portion of the long lock shaft 28 is inserted into the lock holes, the pivot holder 20 and the tray 21 are coupled to each other at two axes, so that they are relatively fixed to each other in the rotational direction. In a case where the tray 21 is used to exchange the probe card PC, the tray 21 is moved up to be horizontal, and fixed by the lock member 27 (FIG. 1). In a case where the tray 21 is not used, the tray 21 is moved down to be vertical, and fixed by the lock member 27 (FIG. 2).

As shown in FIG. 1, the tray 21 can be vertically driven by the cylinder 22 in a state that the tray 21 is horizontally maintained. In this case, the tray 21 is guided by a pair of right and left guide rails 31, which are provided behind the pivot holder 20, as shown in FIG. 13. The guide rails 31 are provided on a vertical plate 32, and the vertical plate 32 is supported by the attachment 18 fixed to the distal end of the lower swing base 17. Moreover, a pair of guide blocks 30, which are engaged with the guide rails 31, are provided on the back surface of the pivot holder 20. Moreover, a stopper (not shown) is provided at each of upper and lower end sides of the vertical plate 32. Pins (not shown) are provided on the back surface of the pivot holder 20 so as to be brought into contact with these stoppers, thereby lift ends of the tray 21 are defined.

A circular opening 21a is formed at the center of the tray 21 not to cause an interference with the probes or contact elements CE of the probe card PC. As shown in FIGS. 5 and 13, a pair of positioning pins 33 is provided on the upper surface of the tray 21. The pins 33 are inserted to holes 34a of the card holder 34 for holding the card body 45, so that the probe card PC is positioned on the tray 21. Moreover, four cushion plates 35, which are formed of elastic material such as rubber, are formed on the surface of the tray 21. The card holder 34 of the probe card PC is softly landed on the tray 21 through the cushion plates 35.

Small holes 36a are formed in the right and left cushion plates 35, respectively. The small holes 36a are used such that the probe card PC is attracted and fixed to the tray 21 by vacuuming. A vacuum tube (not shown), which is provided at the back of the tray 21, is connected to each of the small holes 36a. The small holes 36a function as a detection terminal of a sensor for detecting the presence or non-presence of the probe card PC on the tray 21. Due to this, the vacuum tube is connected to a pressure sensor 36. In a case where pressure of the vacuum tube detected by the pressure sensor 36 is higher than predetermined pressure, it is detected that the probe card PC is not mounted on the tray 21.

A sensor 37 is provided on the upper surface of the tray 21. The sensor 37 detects the kinds of probe cards PC. For example, an optical sensor is used as sensor 37, and two kinds of probe card PC are classified in advance depending on whether or not a hole for light transmission is formed on the card body 45 or the card holder 34, and/or whether or not a reflected surface is formed thereon. An amount of movement of the Z direction, which is necessary to the work table 4, differs, depending on the types of probe cards, such as the vertical probe type, inclined probe type, and membrane type. Therefore, data obtained by the sensor 37 is stored in a memory to be used to control the operation of the work table 4.

As shown in FIGS. 1 and 2, a cover 2a is provided at the front of the probe apparatus so as to cover the tray 21 and an entrance of the tray 21, when the tray 21 is not used. The cover 2a is structured such that it is guided up and down by a guide mechanism (not shown) and its upper portion 2b is moved down to the outside so as to prevent the upper portion 2b from interfering with the tray 21 when the cover 2a is guided up and down.

Figure 11:
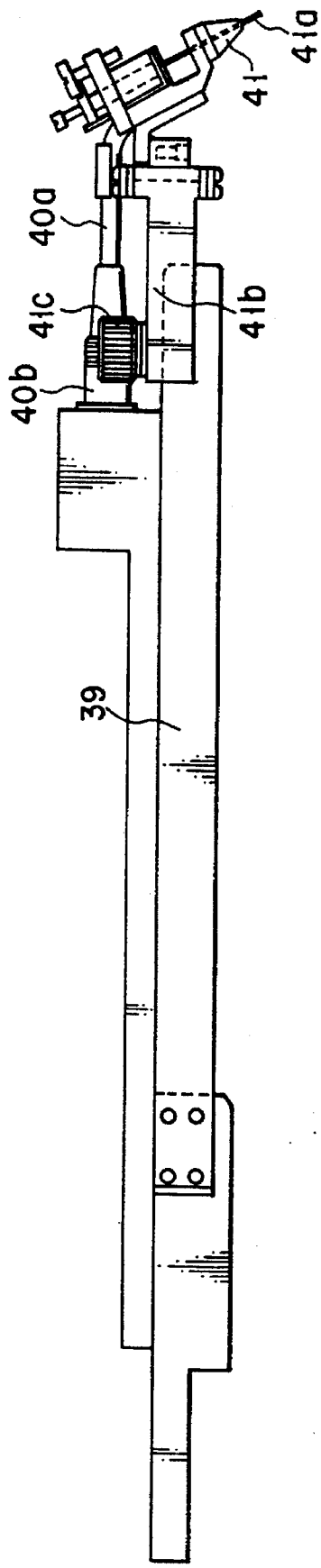
FIGS. 11 and 12 are a side view and a plane view, respectively, showing the details of the pen and an arm of the marking mechanism of FIG. 7.
Figure 12:
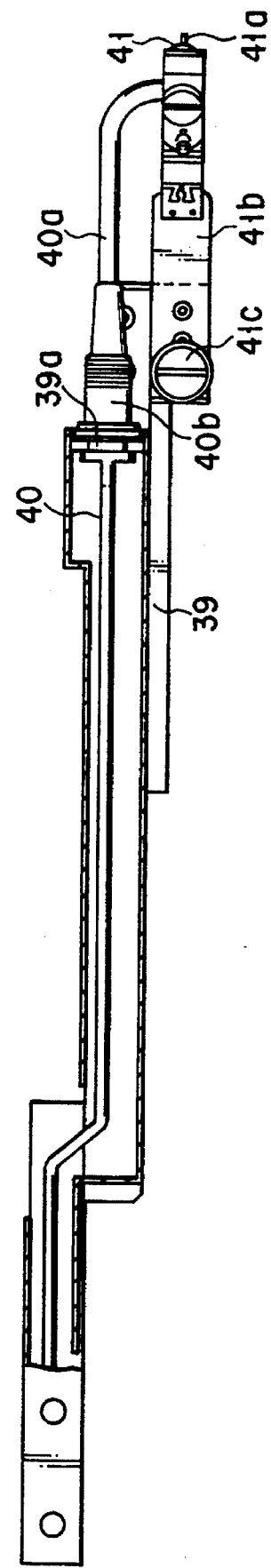

The marking mechanism 7 is arranged adjacent to the card conveyer 5, as shown in FIGS. 6 and 7. As shown in FIGS. 11 and 12, the marking mechanism 7 comprises an upper swing base 38, which is fixed to the vertical shaft 13 of the swing driver 8. A hollow arm 39 is connected to the distal end of the upper swing base 38 to be extended along the pivot holder 20 and the vertical plate 32. A driving tube 40 for supplying air so as to drive a marking ink is provided in the arm 39. A pen 41 having an ink tank is detachably attached to the distal end of the arm 39. The ink is dropped onto the defective IC chip on the wafer W from a pen tip 41a of the pen 41, and a mark is formed thereon.

A key is formed in an inner peripheral surface of the upper swing base 38, and the key is inserted into a key groove of the shaft 13 of the swing driver 8. In other words, the upper swing base 38 rotates with the vertical shaft 13 as one unit. Therefore, the arm 39, tube 40 and pen 41 of the marking mechanism 7 are swung between one side surface of the casing 2 (e.g., front surface) and the probing area. When the pen 41 is moved to the probing area, the pen tip 41a is positioned within the outline of the card body 45 of the probe card PC in a horizontal plane. Since the pen 41 of the marking mechanism 7 is structured to be horizontally and rotatably movable between one side of the probe apparatus and the probing area, it is unnecessary to form a marking area independently of the probing area.

As shown in FIGS. 11 and 12, the pen 41 is detachably provided to the distal end of the arm 39 through an attachment 41b. The pen 41 is fixed to the distal end of the attachment 41b, and a female screw hole is formed in the proximal end. A female screw hole, which corresponds to the female hole of the attachment 41b, is formed in the distal end of the arm 39. In a state that the proximal end of the attachment 41b is overlaid on the distal end of the arm 39, a male screw member 41c is engaged with the female screw holes, and the pin 41 is fixed to the arm 39.

To the distal end of the driving tube 40, e.g., a flexible tube 40a connected to the pen 41 and a joint portion 40b attached to the proximal end of the flexible tube 40a are connected. A receiving port 39a, which communicates with the tube 40, is formed at the distal end of the arm 39, and the Joint portion 40b is inserted into the receiving port 39a. Therefore, the arm 39 and the attachment 41b are connected to each other through the male screw member 41c, and the pen 41 is connected to the tube 40, by inserting the joint portion 40b of the flexible tube 40a unified with the pen 41 into the receiving port 39a of the arm 39.

As shown in FIGS. 1 and 2, a small door 2c is formed at the front of the casing 2 above the cover 2a for the tray 21. The small door 2c is used to attach and detach the pen 41. The small door 2c is placed above a pen storing position when the marking mechanism 7 is not used. The lower end of the small door 2c is hinge-connected to the casing 2. If the door 2c of the casing 2 is opened, the pen 41 can be attached to and detached from the arm 39, or the marking mechanism 7 can be maintained.

For swinging the tray 21, it is needed that the upper swing base 38 of the marking mechanism 7 be connected to the lower swing base 17 of the card conveyer 5. The reason is that the lower swing base 17 is not fixed to the vertical shaft 13 of the swing driver 8 in the rotational direction. In other words, driving force of the vertical shaft 13 is transmitted to the lower swing base 17 through the upper swing base 38.

Due to this, as shown in FIG. 9, a coupling air cylinder 42 is fixed to the lower side of the swing base 17. A vertical motion rod 43 of the cylinder 42 is passed through a hole 17a of the lower swing base 17, and its upper end can be inserted into a recess 38a formed in the upper swing base 38. On the other hand, the lower end of the rod 43 can be inserted into an opening 44a formed in a fixing plate 44 fixed to the casing 2.

At the time of marking, the upper end of the rod 43 is disengaged from the upper swing base 38, and the lower end of the rod 43 is engaged with the fixing plate 44. Due to this, the connection between the upper and lower swing bases 38 and 17 is released, and the lower swing base 17 is moored by the fixing plate 44. Under this state, the arm 39 of the marking mechanism 7 is solely swung by the swing driver 8.

At the time of exchanging the probe card PC, the lower end of the rod 43 is disengaged from the fixing plate 44, and the upper end of the rod 43 is engaged with the upper swing base 38. Due to this, the mooring of the lower swing base 17 is released, and the upper and lower side bases 38 and 17 are connected to each other. Under this state, as shown in FIG. 6, the tray 21 of the card conveyer 5 and the arm 39 of the marking mechanism 7 are swung by the swing driver 8 as one unit.

A swing angle of the tray 21 and the arm 39 at the time of exchanging the probe card PC and a swing angle of the arm 39 at the time of marking are respectively defined by a stopper mechanism in a manner as follows.

Figure 14:
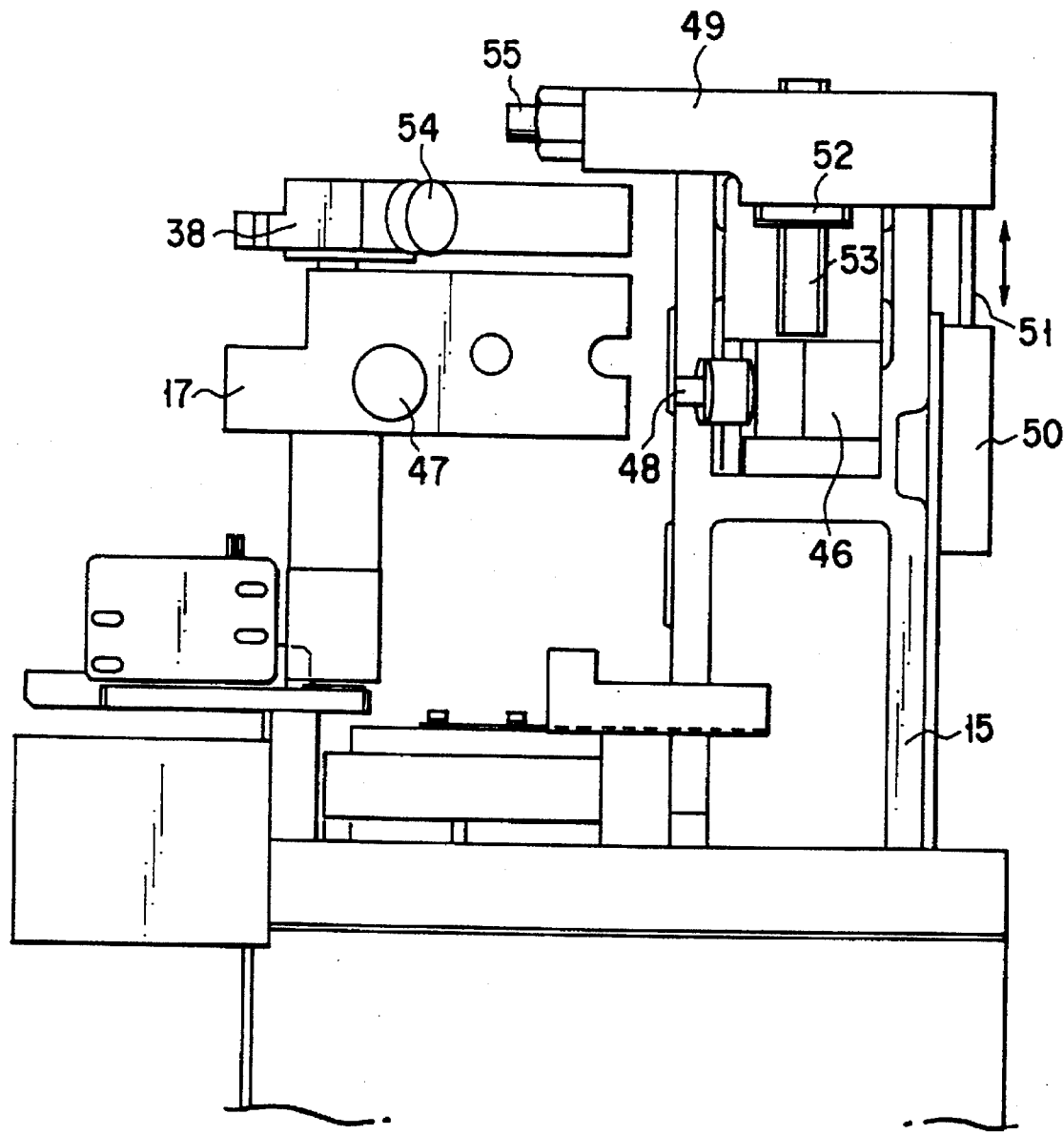
FIG. 14 is a side view showing the relationship among the card conveyer of FIGS. 6 and 7, the marking mechanism, and stoppers.
Figure 15:
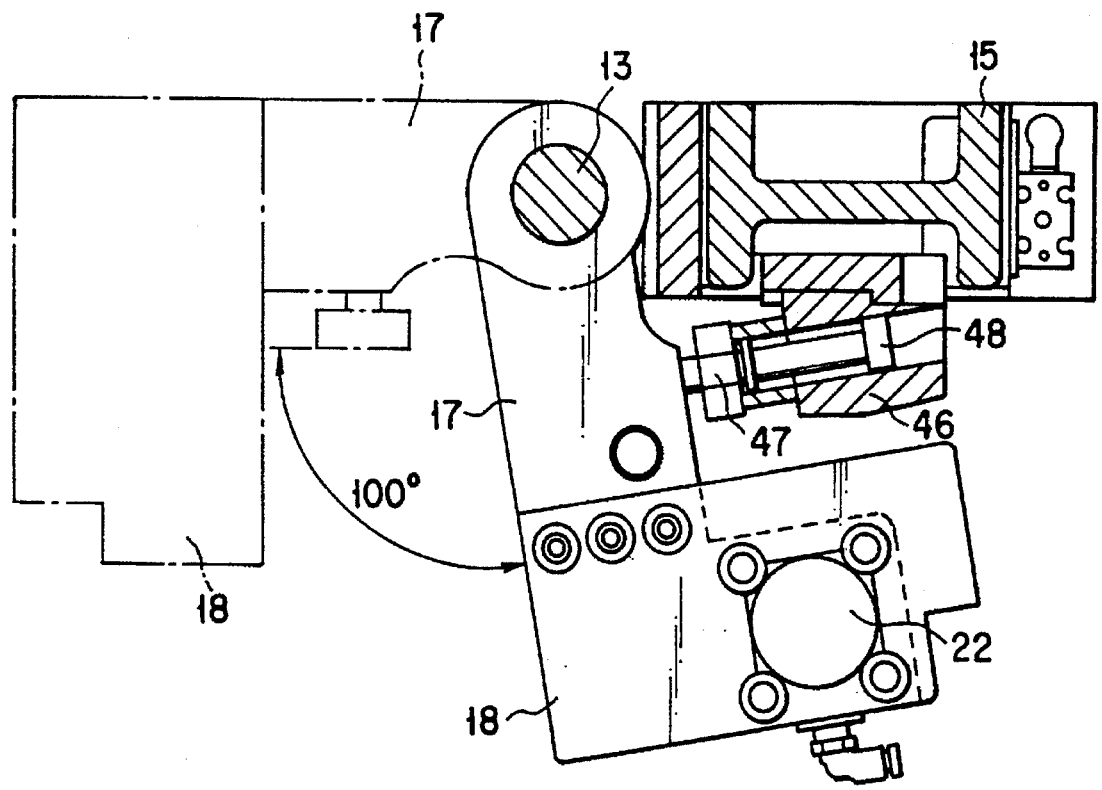
FIG. 15 is a partially broken plane view showing the stopper of the card conveyer of FIG. 6.

As shown in FIGS. 14 and 15, a stopper 46 used in exchanging the probe card PC is attached to the test head support 15. On the other hand, a contact member 47, which corresponds to the stopper 46, is provided at the side surface of the lower swing base 17. When the upper and lower swing bases 38 and 17 are swung as one unit and the contact member 47 contacts the stopper 46, the swing of the tray 21 is stopped, and the tray 21 is positioned below the insert ring 3.

According to the embodiment of the present invention, as shown in FIG. 15, the tray 21 is set to be placed at the horizontal end position below the insert ring 3 when the upper and lower swing bases 38 and 17 are rotated at 100° from an initial position. The stopper 46 has a spring member inside, and a stopper pin 48 elastically contacts the contact member 47. The contact member 47 is screwed to the lower swing base 17, and its amount of projection can be finely adjusted.

Figure 16:
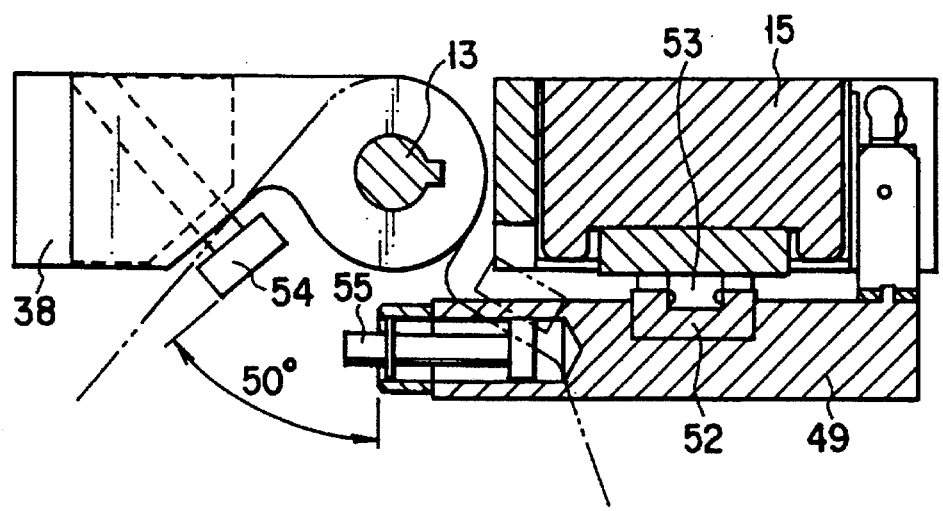
FIG. 16 is a partially broken plane view showing the stopper of the marking mechanism of FIG. 7.

A stopper 49, which is used at the time of marking, is provided on the upper side of the test head support 15 to be movable up and down in a horizontal state, as shown in FIGS. 14 and 16. An end portion of the stopper 49 is connected to an upper end of a vertical motion rod 51 of an air cylinder 50 fixed to the side surface of the test head support 15. A guide groove 52 is formed at the center of the side surface of the stopper 49 to be extended in the vertical direction. The guide groove 52 is engaged with a guide rail 53 formed at the test head support 15. On the other hand, a contact member 54 corresponding to the stopper 49 is provided at the side surface of the upper swing base 38. When the upper swing base 38 swings and the contact member 54 contacts the stopper 49, the swing of the arm 39 is stopped, and the pen 41 is positioned at the marking position.

According to the embodiment of the present invention, as shown in FIG. 16, the pen 41 is set to be placed at the marking position when the upper swing bases 38 is rotated at 50° from an initial position. The stopper 49 has a spring member inside, and a stopper pin 55 elastically contacts the contact member 54. The contact member 54 is screwed to the upper swing base 38, and its amount of projection can be finely adjusted.

At the time of marking, the stopper 49 is moved down to a position contacting the contact member 54 of the upper swing base 38. On the other hand, at the time of exchanging the probe card PC, the stopper 49 is moved up to a portion where no interference with the upper swing base 38 is caused.

Figure 17:
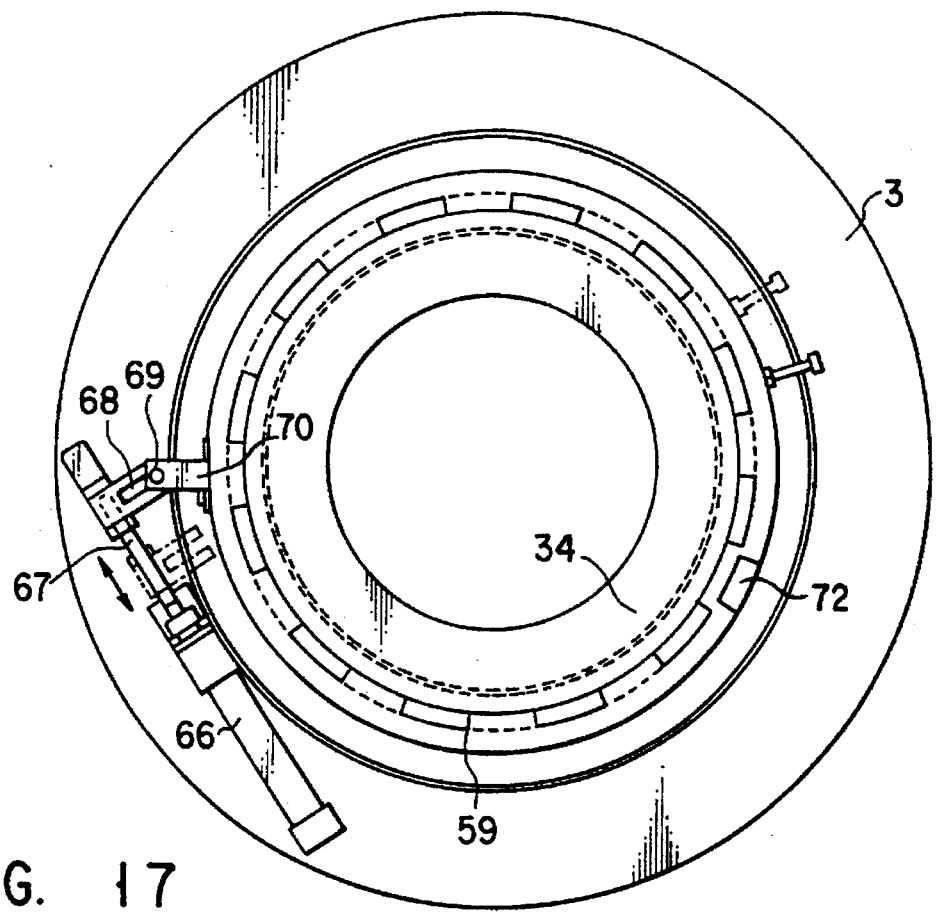
FIG. 17 is a bottom view showing the insert ring and a card clamp of the probe apparatus of FIG. 1.
Figure 18:
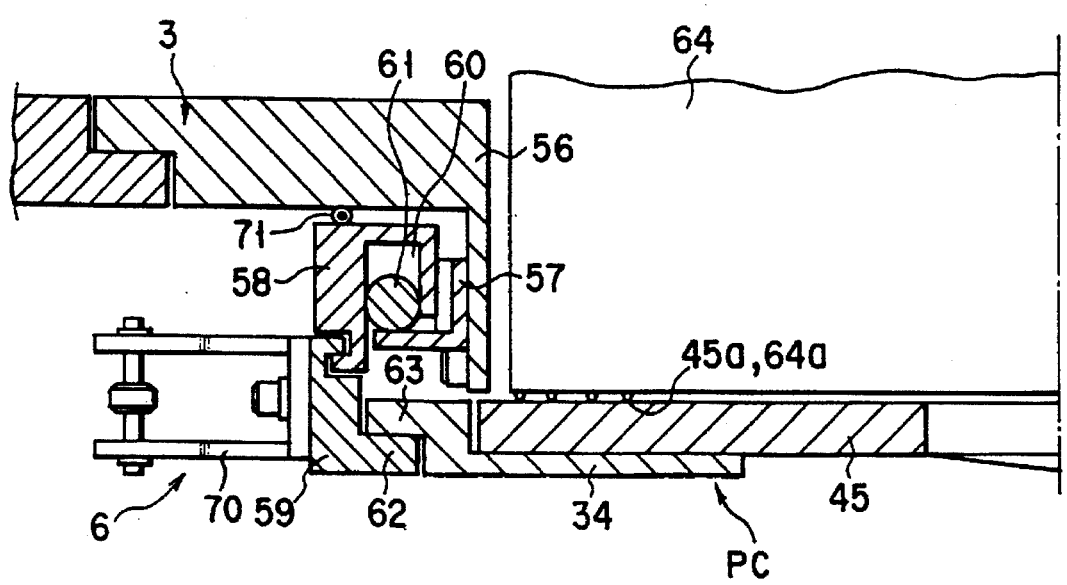

The insert ring 3 to which the card clamp 6 is incorporated is structured as shown in FIGS. 4, 17, and 18. The insert ring 3 comprises a ring casing 56, which is flat and cylindrical, and has a flange. A first ring 57 whose cross section is L-shaped is attached to an outer peripheral surface of the ring casing 56. A second ring 58 whose cross section is U-shaped is attached to cover a horizontal portion of the first ring 57. A rotational ring 59 is attached to the lower end of the second ring 58 through a groove formed at the outer peripheral surface of the lower end of the second ring 58. A seal member 71 is provided between the upper surface of the second ring 58 and the lower surface of the flange of the insert ring 3. The rotational ring 59 is provided with a sensor 72 for detecting presence and non-presence of the probe card PC on the ring 59.

An O-ring 61 is arranged at a lower end of a circular space 60 which is formed by the inverse U-shaped portion of the second ring 58, so that the space 60 is set to be airtight. The O-ring 61 is mounted on the horizontal portion of the first ring 57. A plurality of engaging fins 62 are formed at the lower end of the rotational ring 59 equidistantly in a circumferential direction. On the other hand, a plurality of engaging fins 63 are formed around the card holder 34 equidistantly in a circumferential direction at intervals the same as the engaging fins 62. When the engaging fins 63 of the card holder 34 are supported by the engaging fins 62 of the rotational ring 59, the probe card PC can be attached to the insert ring 3.

In the airtight space 60, tubes for supplying and discharging gas such as air are connected, and the pressure of the space 60 is adjusted, so that the rotational ring 59 is moved up and down. When the pressure of the space 60 is increased, the rotational ring 59 is moved up, and the card holder 34 is fixed to the insert ring 3. In this case, contact terminals 45a of the probe card PC on its rear surface are brought into electrically contact with contact terminals of the contact ring 64 such as pogo-pins 64a. On the other hand, when the pressure of the space 60 is reduced, the rotational ring 59 is moved down, and communication with the card conveyer 5 can be obtained.

An air cylinder 66 is connected to the rotational ring 59 for rotating the ring 59. A first connection piece 68 having a long hole is attached to a rod 67 of the air cylinder 66. A roller pin 69 is inserted into the long hole of the first connection piece 68. The roller pin 69 is supported by a second connection piece 70 fixed to the rotational ring 59. The rotational ring 59 can be bidirectionally rotated by expanding and contracting the rod 67 of the air cylinder 66.

The relative position between the engaging fins 62 of the rotational ring 59 and the engaging fins 63 of the card holder 34 are changed by the rotation of the ring 59. The card holder 34 is inserted to and detached from the rotational ring 59 in a state that the engaging fins 62 and the engaging fins 63 are positioned alternately. On the other hand, when the rotational ring 59 is moved up in a state that the engaging fins 62 and the engaging fins 63 are overlapped, the probe card PC is fixed to the insert ring 3. The air cylinders 9, 22, 42, 50, 66, and the space 60 for moving the rotational ring 59 are connected to a pneumatic system 81 for individually operating these members by air supply and exhaust. The pneumatic system 81 includes a pressure air source, and electromagnetic valves, and these are operated under control of a control unit 82. A warning generator 83 is connected to the control unit 82, and a warning is made by a control signal sent from the control unit 82 in accordance with the position of the tray 21 to be described later. A program, which is necessary to the probe apparatus, such as an operation sequence of the tray 21 is stored in a memory 84.

A display 85 is provided on the upper side of the probe apparatus. The display 85 is formed of an LCD of a so-called touch panel type in which an input operation can be performed by directly pressing the screen. The display 85 can be inclined at various angles and can be horizontally rotated to obtain a suitable angle such that the screen can be easily seen and easily operated in accordance with the operator's position. In place of the panel touch type, it is possible to employ a system utilizing a remote pointing apparatus such as a mouse, in which the input operation is performed as moving a mouse pointer on the screen.

The following will explain the method for exchanging the probe card in the probe apparatus.

In a case where the check of IC chips of a certain kind of wafer is ended and the check of IC chips of another kind of wafer is performed, it is needed that the probe card PC be exchanged. In this case, the cover 2a is first moved down, and the tray 21 is set in the usable state. Then, the lock member 27 is once released, and the tray 21 is raised, and locked in the horizontal state by the lock member 27. In order to unload the used probe card PC, the operator performs a confirming operation to the display screen of the display 85 (e.g., a confirmation of a mode displayed on the display 85 and pushing an image of "confirmation").

At the time of exchanging the probe card, the lower end of the rod 43 of the air cylinder 42 is disengaged from the fixing plate 44, and the upper end of the rod 43 is engaged with the upper swing base 38. Due to this, mooring of the lower end swing base 17 is released, and the upper and lower swing bases 38 and 17 are connected to each other. The stopper 49 is moved up by the air cylinder 50 to retreat to the high position where no interference with the upper swing base 38 is caused.

When the confirming operation is performed by the operator, for example, a buzzer is sounded for five seconds from the warning generator 83. Thereafter, the rack 11 is driven by the air cylinder 9, and the shaft 13 is started to be rotated. Thereby, the tray 21 is swung, and enters the casing 2 from the initial position located outside and in front of the casing 2 (FIG. 19). When the tray 21 is further rotated, the contact member 47 of the lower swing base 17 comes in elastically contact with the stopper pin 48 of the stopper, and the tray 21 is stopped at the horizontal end position below the insert ring 3 (FIG. 20). Then, by the drive of the air cylinder 22, the tray 21 is moved up to a transfer position where the probe card PC is received from the rotational ring 59.

Next, pressure of the airtight space 60 is reduced through the pneumatic system 81, and the rotational ring 59 is slightly moved down. Thereby, clamping against the card holder 34 is loosed and the card holder 34 is mounted on the tray 21 as being positioned by the pin 33. Then, the rotational ring 59 is rotated by the air cylinder 66, and the engaging fins 62 are disengaged from the engaging fins 63 of the card holder 34. In this state, the tray 21 is moved down by the air cylinder 22, and the probe card PC is released below the rotational ring 59.

At this time, non-presence and presence of the probe card PC are detected by the sensors 72 and 36, respectively, and it is confirmed that the probe card PC has been transferred from the rotational ring 59 onto the tray 21. If the transfer of the probe card PC is not detected, the same operation for transferring the probe card PC is repeated. The repetition is performed until the transfer of the probe card PC is detected.

After the transfer of the probe card, the rotational ring 59 is rotated to the original position and moved up, and returned to the initial state substantially the same as that when the rotational ring 59 supports the probe card PC.

When the transfer of the probe card PC is detected, the probe card PC is attracted and fixed onto the tray 21 by the vacuum holes 36a. Then, the shaft 13 is rotated by the air cylinder 9 so that the tray 21 supporting the used probe card PC thereon is started swinging toward the initial position. The tray 21 is stopped at a position just before the tray 21 is moved to the outside of the casing 2, and for example, a buzzer is sounded from the warning generator 83. In this case, the buzzer is continued until an operator performs a confirming operation (e.g., a confirmation of a mode displayed on the display 85 and pushing an image of "confirmation").

The position just before the tray 21 is transferred to the outside of the casing 2 is a position where the tray 21 is located at a slightly inner side from the outer surface of the casing 2 if the outline of the tray 21 is larger than that of the card holder 34 of the probe card PC. Instead, the position just before the tray 21 is transferred to the outside of the casing 2 is a position where the card holder 34 is located at a slightly inner side from the outer surface of the casing 2 if the outline of the tray 21 is smaller than that of the card holder 34 of the probe card PC. The latter case is applied to this embodiment.

When the operator performs the confirming operation, the tray 21 is started swinging again (FIG. 21), and returned to the initial position outside the casing 2. Then, the operator detaches the used probe card PC on the tray 21, and a new probe card PC is mounted on the tray 21 (FIG. 22). In this case, the pins 33 of the tray 21 are inserted into the holes 34a of the probe card PC, and the probe card PC is correctly positioned.

Then, in order to load the new probe card PC, the operator performs a confirming operation (e.g., a confirmation of a mode displayed on the display 85 and pushing an image of "confirmation"). When the confirming operation is performed by the operator, for example, a buzzer is sounded for five seconds from the warning generator 83. Thereafter, the shaft 13 is rotated by the air cylinder 9, and the tray 21 is swung from the initial position outside the casing 2 to the horizontal end position directly below the insert ring 3 until the contact member 47 comes in contact with the stopper 46.

Then, pressure of the airtight space 60 is reduced through the pneumatic system 81, and the rotational ring 59 is slightly moved down. The rotational ring 59 is rotated by the air cylinder 66, and the engaging fins 62 are arranged not to interfere with the engaging fins 63 of the card holder 34. Then, by the drive of the air cylinder 22, the tray 21 is moved up to the transfer position where the probe card PC can be transferred onto the rotational ring 59. In this case, the engaging fins 63 of the card holder are passed between the engaging fins 62 of the rotational ring 59.

Next, the rotational ring 59 is rotated so that the engaging fins 62 and the engaging fins 63 are overlapped. Then, air is supplied to the airtight space 60, and the rotational ring 59 is moved up. Thereby, the card holder 34 is fixed to the insert ring 3, and the contact terminals 45a of the probe card PC are pushed onto the pogo-pins 64a of the contact ring 64.

At this time, non-presence and presence of the probe card PC are detected by the sensors 36 and 72, respectively, and it is confirmed that the probe card PC has been transferred from the tray 21 onto the rotational ring 59. If the transfer of the probe card PC is not detected, the same operation for transferring the probe card PC is repeated. The repetition is performed until the transfer of the probe card PC is detected.

When the transfer of the probe card PC is detected, the tray 21 is started swinging toward the initial position. The tray 21 is stopped at the position just before the tray 21 or card holder 34 is moved to the outside of the casing 2, and for example, a buzzer is sounded from the warning generator 83. In this case, the buzzer is continued until an operator performs a confirming operation (e.g., a confirmation of a mode displayed on the display 85 and pushing the image of "confirmation").

When the confirming operation is performed by the operator, the tray 21 is started swinging again, and returned to the initial position outside the casing 2. Then, the lock member 27 is once released, the tray 21 is moved down, and locked in a vertical state by the lock member 27. The cover 2a is closed, and the exchanging operation of the probe card PC is ended.

The following will explain the marking method in the probe apparatus.

In a case where a mark is provided onto a defective IC chip by the marking mechanism 7, the operator confirms on the display 85 whether or not the pen 41 is attached to the distal end of the arm 39. If the pen 41 is not attached, the door 2c is opened, and the pen 41 is attached to the distal end of the arm 39. Then, in order to start the marking, the operator performs a confirming operation to the display screen of the display 85 (e.g., a confirmation of a mode displayed on the display 85 and pushing an image of "confirmation").

At the time of marking, the upper end of the rod 43 of the air cylinder 42 is disengaged from the upper swing base 38, and the lower end of the rod 43 is engaged with the fixing plate 44. Due to this, the coupling of the upper and lower swing bases 38 and 17 are released, and the lower swing base 17 is moored by the fixing plate 44. The stopper 49 is moved down by the air cylinder 50 to advance to the lower position where the stopper 49 interferes with the upper swing base 38.

If the confirming operation is performed by the operator, the shaft 13 is rotated by the air cylinder 9, and the arm 39 is swung to the probing area. At this time, the tray 21 is moored in an unusable state. The arm 39 is stopped when the contact member 54 of the upper swing base 38 comes in elastically contact with the stopper pin 55 of the stopper 49 as shown in FIG. 16. At this time, the pen tip 41a of the pen 41 is portioned in the outline of the card body 45 of the probe card PC in a horizontal plane.

When the pen tip 41a reaches the probe position, the work table 4 is driven based on the position of the defective IC chip stored in the memory. If the defective IC chip is placed opposite to the pen tip 41a by the movement of the work table, ink is dropped from the pen tip 41a. In this way, the marking is sequentially provided to each of defective IC chips. If a series of markings is ended, the arm 39 is returned to the initial position. Then, the wafer W is transferred to a next step, for example, a step of baking the ink.

According to the probe apparatus of the present invention, since the tray 21 is vertically moved down to be stored, and horizontally moved up only when it is used, the probe apparatus can be made compact. Moreover, since the marking position is set in the probing area, the probe apparatus can be made compact. Furthermore, the swing driver is used in both the card conveyer 5 and the marking mechanism 7, the manufacturing cost of the apparatus can be reduced, and the apparatus can be made compact.

At the time of exchanging the probe card PC, the probe card PC can be automatically exchanged for a new probe card PC by only the operation on the display 85, except that an operator treat the probe cards outside the casing 2. In this case, the cushion plates 35 having the vacuum holes 36a, which are formed on the tray 21, allow the probe cards PC to be transferred in a stable state. Moreover, since the presence and non-presence of the probe cards PC on the tray 21 can be detected by the sensor 36, the transfer of the probe cards between the tray 21 and the rotational ring 39 can be surely executed. Since the height of the tray 21 to the insert ring 3 can be adjusted by the air cylinder 22, the probe apparatus can deal with the difference in the kinds of probe cards, and the individual difference of probe cards.

Moreover, an operator is informed of the movement of the tray 21 by the warning buzzer at the time of exchanging the probe card PC, the working can be safely executed. As a method for issuing a warning to the operator, a visual signal such as a lamp can be used in place of an acoustic signal such as the buzzer. Moreover, both the acoustic signal and the visual signal may be used. A message such as "moving to outside" can be displayed on the display screen on the display 85. Moreover, in a case where the used and new probe cards PC are transferred from and onto the tray 21 outside the casing 2 by a robot, it is possible to provide a simple electrical signal as a warning signal.

The temporary stop of the tray 21 before being moved to the outside of the casing 2 can be set based on the program. Or, the sensor for detecting the tray 21 may be provided so as to set the temporary stop of the tray 21 based on the signal sent from the sensor. Moreover, in place of such a temporary stop, the warning may be issued before the rotational ring 39 is moved down, and the rotational ring 39 may be started moving down after an operator's confirming operation.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A probe apparatus for examining an electrical characteristic of IC chips formed on a semiconductor wafer and having a plurality of electrode pads, comprising:
   a casing;
   a work table arranged in said casing for mounting said wafer thereon;
   an insert ring arranged above said work table and supported by said casing;
   a probe card detachably attached to said insert ring, said probe card having a plurality of contact elements to be respectively brought into contact with said electrode pads of said IC chips;
   a card exchanging mechanism for automatically attaching and detaching said probe card to and from said insert ring, said card exchanging mechanism comprising a tray for conveying said probe card between an initial position outside said casing and a position inside said casing, and said tray being movable at said initial position between a usable state where said tray is expanded to mount said probe card thereon and an unusable state in which said tray is folded along one side wall of said casing;
   a cover, provided on said casing, for covering said tray in said unusable state; and
   a controlling section for controlling an operation of said card exchanging mechanism in accordance with a predetermined program.

2. The probe apparatus according to claim 1, wherein said tray is provided with a manually operable lock member to lock and unlock said tray in said usable state.

3. The probe apparatus according to claim 1, wherein holding means is provided on said tray to hold said probe card by a vacuum.

4. The probe apparatus according to claim 1, wherein a sensor is provided on said tray to detect presence and non-presence of said probe card on said tray.

5. The probe apparatus according to claim 1, wherein a sensor is provided on said tray to detect a kind of said probe card.

6. The probe apparatus according to claim 1, wherein said controlling section issues an electrical warning signal before said tray is moved out of said casing to said initial position.

7. The probe apparatus according to claim 6, wherein means for forming an acoustic signal or a visual signal from said warning signal is connected to said controlling section.

8. The probe apparatus according to claim 1, wherein said controlling section issues an electrical warning signal before said tray is started from said initial position.

9. The probe apparatus according to claim 1, wherein a display is connected to said controlling section, and an input to said controlling section is made by pressing a screen of said display.

10. A probe apparatus as recited in claim 1, wherein said tray is manually foldable at said initial position between said usable state and said unusable state in which said tray is folded along one side wall of said casing.

11. A probe apparatus for examining an electrical characteristic of a target object having a plurality of electrode pads, comprising:
   a casing;
   a work table arranged in said casing for mounting said target object thereon;
   an insert ring arranged above said work table and supported by said casing;
   a probe card detachably attached to said insert ring, said probe card having a plurality of contact elements to be respectively brought into contact with said electrode pads of said target object;
   a card conveyer having a tray for conveying said probe card, said tray being movable between an initial position outside said casing and a transfer position below said insert ring, said tray being movable at said initial position between a usable state where said tray is expanded to mount said probe card thereon and an unusable state in which said tray is folded along one side wall of said casing;

a cover, provided in said casing, for covering said tray in said unusable state;

a card clamp for fixing said probe card to said insert ring and transferring said probe card to and from said tray placed at said transfer position, said probe card being automatically attached to and detached from said insert ring in cooperation with said card conveyer and said card clamp; and a controlling section for controlling an operation of said card conveyer and said card clamp in accordance with a predetermined program.

12. The probe apparatus according to claim 11, wherein said card clamp comprises a rotational ring, supported by said insert ring, for fixing said probe card to said insert ring, said rotational ring being movable up and down and rotatable and having a plurality of engaging fins for selectively engaging and disengaging with said probe card by a rotation of said rotational ring.

13. The probe apparatus according to claim 11, wherein said card conveyer comprises a lifting member movable together with said tray in a horizontal direction, for moving said tray between a horizontal end position below said insert ring and said transfer position.

14. The probe apparatus according to claim 11, wherein said tray is swung between said initial position and said horizontal end position.

15. The probe apparatus according to claim 11, wherein said tray is provided with a manually operable lock member to lock and unlock said tray in said usable state.

16. The probe apparatus according to claim 11, wherein said controlling section issues an electrical warning signal before said tray is moved out of said casing to said initial position from said casing.

17. The probe apparatus according to claim 16, wherein means for forming an acoustic signal or a visual signal from said warning signal is connected to said controlling section.

18. The probe apparatus according to claim 11, wherein a display is connected to said controlling section, and an input to said controlling section is made by pressing a screen of said display.

19. The probe apparatus according to claim 11, wherein said target object comprises IC chips formed on a semiconductor wafer, wherein said apparatus further comprises a marking mechanism for providing a mark to an IC chip recognized to be defective by an examination, and wherein said marking mechanism comprises a pen movable between a usable position placed below said insert ring and an unusable position separated from said insert ring.

20. The probe apparatus according to claim 19, wherein said pen is supported by a swing arm, and said swing arm and said tray have a swing driver in common.

21. The probe apparatus according to claim 20, further comprising means for changing states of said swing arm between a state where said arm is swung with said tray as one unit and a state where said arm is swung independently of said tray.

22. A probe apparatus as recited in claim 11, wherein said tray is manually foldable at said initial position between said usable state and said unusable state in which, said tray is folded along one side wall of said casing.

* * * * *